(12) United States Patent
Morihara et al.

(10) Patent No.: US 9,048,053 B2
(45) Date of Patent: Jun. 2, 2015

(54) ELECTROSTATIC MICRO RELAY AND MANUFACTURING METHOD FOR THE SAME

(71) Applicants: Daisuke Morihara, Shiga (JP);
Takahiro Masuda, Kyoto (JP);
Yasuhiro Horimoto, Shiga (JP)

(72) Inventors: Daisuke Morihara, Shiga (JP);
Takahiro Masuda, Kyoto (JP);
Yasuhiro Horimoto, Shiga (JP)

(73) Assignee: OMRON Corporation, Kyoto (JP)

( * ) Notice: Subject to any disclaimer, the term of this patent is extended or adjusted under 35 U.S.C. 154(b) by 69 days.

(21) Appl. No.: 14/051,031

(22) Filed: Oct. 10, 2013

(65) Prior Publication Data
US 2014/0184352 A1 Jul. 3, 2014

(30) Foreign Application Priority Data

Dec. 28, 2012 (JP) ................................. 2012-288457

(51) Int. Cl.
*H01P 1/10* (2006.01)
*H01H 59/00* (2006.01)
*H01H 65/00* (2006.01)

(52) U.S. Cl.
CPC ........... *H01H 59/0009* (2013.01); *H01H 65/00* (2013.01); *Y10T 29/49105* (2013.01)

(58) Field of Classification Search
None
See application file for complete search history.

(56) References Cited

U.S. PATENT DOCUMENTS

| 6,307,169 | B1 | 10/2001 | Sun et al. | |
| 7,619,497 | B2 * | 11/2009 | Yuba et al. | 335/78 |
| 2005/0280975 | A1 * | 12/2005 | Iwata et al. | 361/160 |
| 2014/0253260 | A1 * | 9/2014 | Horimoto et al. | 333/105 |

FOREIGN PATENT DOCUMENTS

| EP | 1246216 | * 10/2002 |
| JP | 2005-197265 | * 7/2005 |

* cited by examiner

*Primary Examiner* — Tuan T Lam
(74) *Attorney, Agent, or Firm* — Osha Liang LLP

(57) ABSTRACT

An electrostatic micro relay has a substrate, a signal line arranged on the substrate and having an input point configured to receive a signal and a plurality of signal channels configured to distribute the signal, the plurality of signal channels being each formed with a fixed contact, a plurality of movable contacts, each provided with respect to each of the fixed contacts and arranged so as to be opposed to a corresponding fixed contact across a space, a plurality of movable electrodes, each connected to each of the plurality of movable contacts and configured to make the connected movable contact brought into contact with and separated from the corresponding fixed contact, a cap, formed with a space configured to house the plurality of movable electrodes, and bonded with the substrate, and a signal input portion.

15 Claims, 20 Drawing Sheets

ELECTROSTATIC MICRO RELAY AND MANUFACTURING METHOD FOR THE SAME

CROSS REFERENCE TO RELATED APPLICATIONS

This application claims priority to Japanese Patent Application No. 2012-288457 filed on Dec. 28, 2012, the entire contents of which are incorporated by reference herein.

BACKGROUND

The present invention relates to an electrostatic micro relay and a manufacturing method for the same.

RELATED ART

A relay or a switch are used for a variety of electric circuits for electrically connecting or cutting off two signal lines. In recent years, there have been proposed a variety of devices using MEMS (Micro Electro Mechanical Systems) technique. For example, U.S. Pat. No. 6,307,169 (Patent Document 1) discloses an SPST (Single Pole Single Throw) switch or an SPDT (Single Pole Double Throw) switch, configured of an MEMS switch.

The SPDT switch disclosed in U.S. Pat. No. 6,307,169 has a configuration equivalent to two SPST switches using a common input. Specifically, one signal line is branched into two lines.

The two SPST switches are controllable independently from each other. There are thus cases where one of the two SPST switches is turned on while the other is turned off. In the SPST switch in the off-state, a fixed contact is separated from a movable contact. The signal line from the point at which the signal is branched to the fixed contact constitutes a stub.

A signal inputted into the signal line is divided into a first signal to be transmitted to the switch in the on-state and a second signal to be transmitted to the switch in the off-state. The second signal is reflected at the end of the stub, to be coupled with the first signal. When a length of the stub is equal to a quarter of a wavelength of the signal, the two signals cancel each other. For this reason, loss in a frequency corresponding to this wavelength increases.

Therefore, in the switch or the electrostatic micro relay which uses the MEMS technique as thus described, it is desirable to reduce loss in higher frequency. However, U.S. Pat. No. 6,307,169 (Patent Document 1) does not disclose a specific method for doing so.

SUMMARY

One or more embodiments of the present invention provides an electrostatic micro relay with improved characteristics in higher frequency, and a manufacturing method for the same.

According to one or more embodiments of the present invention, an electrostatic micro relay is provided. The electrostatic micro relay includes a substrate, a signal line, a plurality of movable contacts, a plurality of movable electrodes, a cap and a signal input portion. The signal line is arranged on the substrate, and has an input point configured to receive a signal and a plurality of signal channels configured to distribute the signal. The plurality of signal channels are each formed with a fixed contact. The movable contact is provided with respect to each fixed contact. The movable contact is arranged so as to be opposed to a corresponding fixed contact across a space. The plurality of movable electrodes are each connected to each of the plurality of movable contacts and configured to make the connected movable contact brought into contact with and separated from the corresponding fixed contact. The cap is formed with a space configured to house the plurality of movable electrodes. The cap is bonded with the substrate. The signal input portion includes a through via connected to the input point of the signal line as passing through the cap or the substrate.

According to one or more embodiments of the present invention, a length of each of the plurality of signal channels from the input point to the fixed contact is equal to each other.

According to one or more embodiments of the present invention, the length of the signal channel from the input point to the fixed contact is the shortest distance defined by arrangement of the plurality of movable electrodes.

According to one or more embodiments of the present invention, the electrostatic micro relay further includes a pair of ground conductors. The pair of ground conductors are arranged on both sides of the signal line on the surface of the substrate.

According to one or more embodiments of the present invention, the electrostatic micro relay further includes a sealing material configured to bond the cap with the substrate, and a plurality of signal output portions. The plurality of signal output portions each include a through via that passes through the cap or the substrate. The plurality of signal output portions is each connected to a section of the signal channel located on the opposite side to the input point with respect to the corresponding fixed contact. The space in the cap is sealed by the sealing material. The sealing material is arranged so as to surround the through vias of the signal input portion and the plurality of signal output portions.

According to one or more embodiments of the present invention, the electrostatic micro relay further includes an external electrode connected to the through via. The external electrode is arranged on the surface of the cap which is located on the opposite side to the opposed surface to the substrate when the through via is provided in the cap. The external electrode is arranged on the surface of the substrate which is located on the opposite side to the surface formed with the signal line when the through via is provided in the substrate.

According to one or more embodiments of the present invention, the plurality of signal output portions each include the through via formed in the cap.

According to one or more embodiments of the present invention, the plurality of signal output portions each include the through via formed in the substrate.

According to one or more embodiments of the present invention, the signal input portion includes the through via formed in the cap.

According to one or more embodiments of the present invention, the signal input portion includes the through via formed in the substrate.

According to one or more embodiments of the present invention, the cap and the substrate are formed of glass.

According to one or more embodiments of the present invention, at least one of the plurality of movable electrodes has a double-supported beam structure configured to support the movable contact.

According to one or more embodiments of the present invention, the plurality of signal channels are two signal channels arranged so as to form one straight line. The signal line has a pad connected to the signal input portion to define the input point.

According to one or more embodiments of the present invention, a manufacturing method for an electrostatic micro relay is provided. The manufacturing method for an electrostatic micro relay includes the steps of: preparing a substrate; and forming a signal line on the substrate. The signal line has an input point configured to receive a signal and a plurality of signal channels configured to distribute the signal. The plurality of signal channels are each formed with a fixed contact. The manufacturing method for an electrostatic micro relay further includes the steps of: forming a plurality of movable contacts, each provided with respect to each of the fixed contacts and arranged so as to be opposed to a corresponding fixed contact across a space, and a plurality of movable electrodes, each connected to each of the plurality of movable contacts; preparing a cap, formed with a through via and a space configured to house the plurality of movable electrodes; and bonding the cap with the substrate by a sealing material. The through via in the cap is connected to the input point of the signal line in the bonding step.

According to one or more embodiments of the present invention, a manufacturing method for an electrostatic micro relay is provided. The manufacturing method for an electrostatic micro relay includes the steps of: preparing a substrate; and forming on the substrate a signal line and a through via to be connected to the signal line. The signal line has an input point configured to receive a signal and a plurality of signal channels configured to distribute the signal. The plurality of signal channels are each formed with a fixed contact. The through via is connected to the input point of the signal line. The manufacturing method for an electrostatic micro relay further includes the steps of: forming a plurality of movable contacts, each provided with respect to each of the fixed contacts and arranged so as to be opposed to a corresponding fixed contact across a space, and a plurality of movable electrodes, each connected to each of the plurality of movable contacts; preparing a cap, formed with a through via and a space configured to house the plurality of movable electrodes; and bonding the cap with the substrate by a sealing material.

According to one or more embodiments of the present invention, it is possible to provide an electrostatic micro relay with improved characteristics in higher frequency, and a manufacturing method for the same.

DETAILED DESCRIPTION

Figure 1:
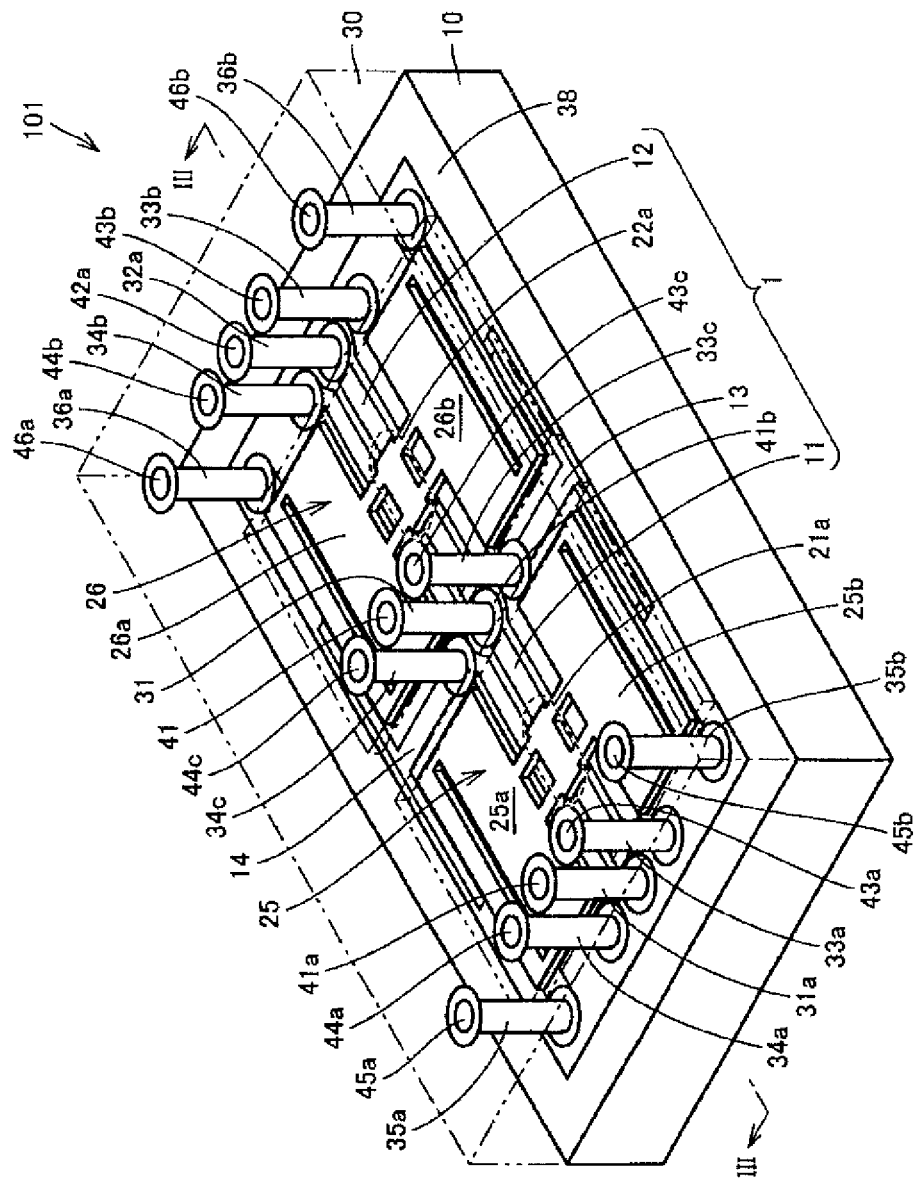
FIG. 1 is a perspective view of an electrostatic micro relay according to a first embodiment of the present invention.

In the following, embodiments of the present invention will be described in detail while referring to the drawings. It is to be noted that identical or corresponding sections in the drawings are provided with the same numeral and a description thereof is not repeated. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

An electrostatic micro relay according to one or more embodiments of the present invention can be suitably used as a high-frequency switch (also referred to as RE switch). The "high-frequency switch" is a switch for switching a channel for a high-frequency signal, or a switch for transmitting and cutting off a high-frequency signal.

In the high-frequency switch, isolation and insertion loss are particularly important characteristics. When the isolation deteriorates in the off-state of the switch, cross talk or noise occurs. Hence, according to one or more embodiments of the present invention, the isolation in the off-state of the high-frequency switch is as high as possible. Further, according to one or more embodiments of the present invention, the insertion loss in the on-state of the switch is as small as possible.

As described below, the electrostatic micro relay according to one or more embodiments of the present invention can satisfy these requirements of the high-frequency switch. Therefore, the electrostatic micro relay according to one or more embodiments of the present invention can be suitably used as the high-frequency switch. However, the intended use of the electrostatic micro relay according to one or more embodiments of the present invention is not restricted to the high-frequency switch.

Embodiment 1

Figure 2:
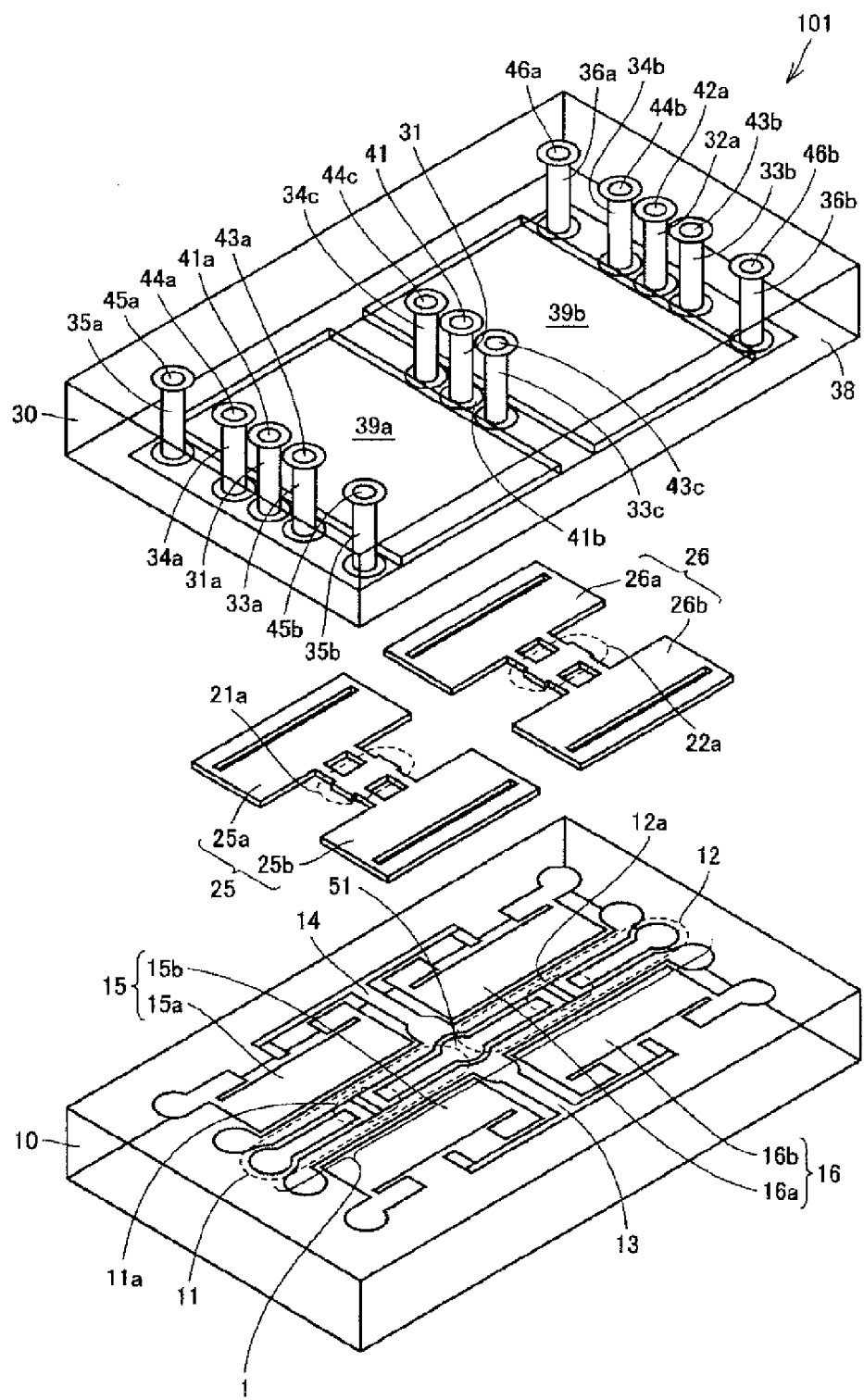
FIG. 2 is an exploded perspective view of the electrostatic micro relay shown in FIG. 1.
Figure 3:
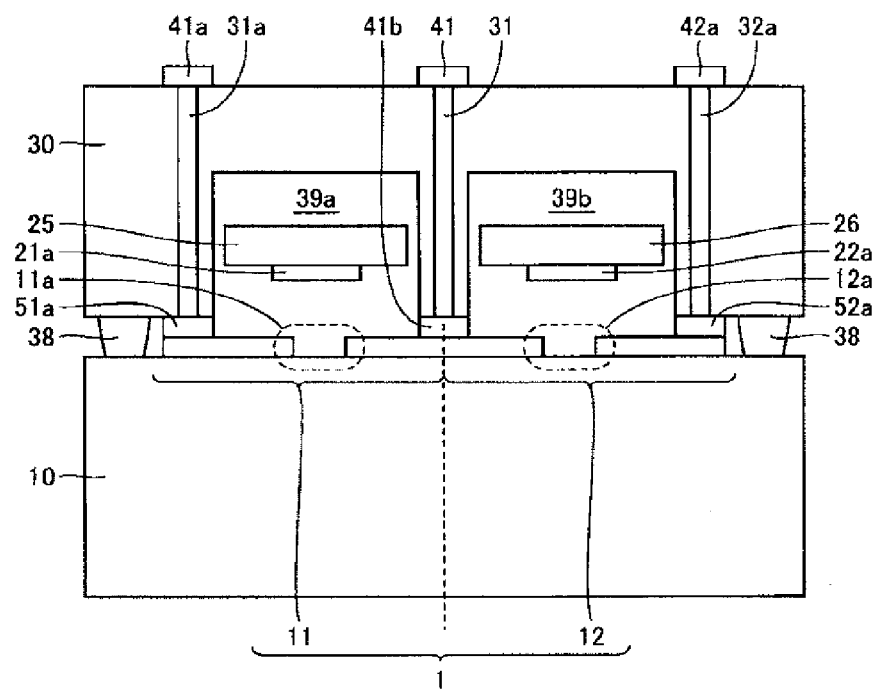
FIG. 3 is a view schematically showing a cross section of the electrostatic micro relay along direction III-III of FIG. 1.
Figure 4:
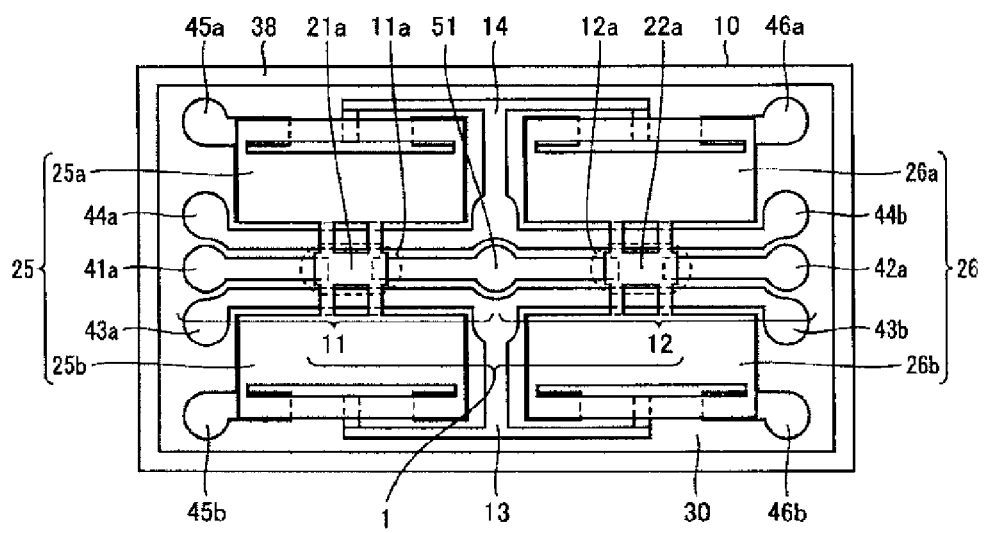
FIG. 4 is a top perspective view of the electrostatic micro relay shown in FIG. 1.

FIG. 1 is a perspective view of an electrostatic micro relay 101 according to a first embodiment of the present invention. FIG. 2 is an exploded perspective view of the electrostatic micro relay 101 shown in FIG. 1. FIG. 3 is a view schematically showing a cross section of the electrostatic micro relay 101 along direction III-III of FIG. 1. FIG. 4 is a top perspective view of the electrostatic micro relay 101 shown in FIG. 1. It is to be noted that FIG. 4 shows wires and actuators (described below) formed on the substrate.

Referring to FIGS. 1 to 4, the electrostatic micro relay 101 according to the first embodiment of the present invention is an electrostatic micro relay configured as an SPDT switch. The electrostatic micro relay 101 has a substrate 10, a signal line 1, ground electrodes 13, 14, and fixed electrodes 15, 16.

The substrate 10 is, for example, a glass substrate. The signal line 1, the ground electrodes 13, 14 and the fixed electrodes 15, 16 are arranged on one surface of the substrate 10.

The signal line 1 includes a pad 51 and signal lines 11, 12. The pad 51 corresponds to an input point where a signal is inputted. The signal lines 11, 12 correspond to two signal channels arranged so as to form one straight line. The signal lines 11, 12 respectively have fixed contacts 11a, 12a. In other words, the signal line 1 is divided into two signal lines (signal lines 11, 12) with the pad 51 (input point) as the center.

The ground electrode 13 is arranged on one side with respect to the signal line 1 on the surface of the substrate 10. The ground electrode 14 is arranged on the other side to the ground electrode 13 on the surface of the substrate 10. In other words, the signal line 1 is arranged between the ground electrodes 13 and 14. That is, in the first embodiment, the signal line 1 constitutes a coplanar waveguide along with the ground electrodes 13, 14.

The fixed electrodes 15, 16 each have two electrodes arranged so as to sandwich the coplanar waveguide. Specifically, the fixed electrode 15 includes electrodes 15a, 15b. The fixed electrode 16 includes electrodes 16a, 16b.

The electrostatic micro relay 101 further includes movable contacts 21a, 22a and actuators 25, 26. The actuators 25, 26 are, for example, formed of silicon. The movable contacts 21a, 22a are metal films formed on an insulating film (e.g., silicon oxide film) which is, for example, formed on the actuators 25, 26.

Each of the actuators 25, 26 is a movable electrode. The actuator 25 makes the movable contact 21a brought into contact with and separated from the fixed contact 11a. The actuator 26 makes the movable contact 22a brought into contact with and separated from the fixed contact 12a.

Each of the actuators 25, 26 has a double-supported beam structure for supporting the movable contact. Specifically, the actuator 25 has electrodes 25a, 25b. The movable contact 21a is connected between the electrodes 25a and 25b. The actuator 26 has electrodes 26a, 26b. The movable contact 22a is connected between the electrodes 26a and 26b.

In the first embodiment, the signal line 1 (signal lines 11, 12 and pad 51) is formed such that the length of the signal line 11 from the pad 51 to the fixed contact 11a is equal to the length of the signal line 12 from the pad 51 to the fixed contact 12a. In other words, a median point of a section of the signal line from the fixed contact 11a to the fixed contact 12a serves as the input point.

The length of the signal line 11 from the input point to the fixed contact 11a and the length of the signal line 12 from the input point to the fixed contact 12a are set so as to be the shortest distance. In one or more embodiments of the present invention, this shortest distance is the shortest distance defined by arrangement of the actuators 25, 26. Specifically, positions of the movable contacts 21a, 22a are determined by arranging the actuators 25, 26 in accordance with the minimum space between the actuators 25 and 26. A median point of a line segment connecting the movable contact 21a and the movable contact 22a corresponds to the input point of the signal. The minimum space between the actuators 25 and 26 can be set, for example, in accordance with a process rule applied in a process for manufacturing the electrostatic micro relay.

When the positions of the movable contacts 21a, 22a are determined, positions of the fixed contacts 11a, 12a are necessarily determined. By minimizing the space between the actuators 25 and 26, the length of the signal line 11 from the input point to the fixed contact 11a and the length of the signal line 12 from the input point to the fixed contact 12a can be set to the shortest distance.

The electrostatic micro relay 101 further includes a cap 30. A material for the cap 30 is, for example, glass. The cap 30 is bonded with the substrate 10 through a sealing material 38 such as glass frit. The cap 30 is formed with cavities 39a, 39b as spaces for respectively housing the actuators 25, 26.

The cap 30 is formed with through vias 31, 31a, 32a, 33a, 33b, 33c, 34a, 34b, 34c, 35a, 35b, 36a, 36b. One side-surface of the cap 30 is formed with external electrodes 41, 41a, 42a, 43a, 43b, 43c, 44a, 44b, 44c, 45a, 45b, 46a, 46b. The external electrodes 41, 41a, 42a, 43a, 43b, 43c, 44a, 44b, 44c, 45a, 45b, 46a, 46b are electrically connected respectively to the through vias 31, 31a, 32a, 33a, 33b, 33c, 34a, 34b, 34c, 35a, 35b, 36a, 36b.

The other side-surface of the cap 30, namely the opposed surface to the substrate 10, is formed with internal electrodes electrically connected respectively to the through vias 31, 31a, 32a, 33a, 33b, 33c, 34a, 34b, 34c, 35a, 35b, 36a, 36b.

These internal electrodes are electrically connected to the pads of the respective electrodes formed on the surface of the substrate 10. FIG. 3 representatively show internal electrodes 41b, 51a, 52a respectively connected to the through vias 31, 31a, 32a.

The through via 31 is electrically connected to the pad 51 through the internal electrode 41b. The through via 31 is a signal input portion that receives a signal through the external electrode 41.

The through via 31a is electrically connected to the end of the signal line 11 located on the opposite side to the pad 51 through the internal electrode 51a. The through via 32a is electrically connected to the end of the signal line 12 located on the opposite side to the pad 51 through the internal electrode 52a. The through vias 31a, 32a function as the signal output portions.

The through vias 33a, 33b, 33c are electrically connected to the ground electrode 13. Similarly, the through vias 34a, 34b, 34c are electrically connected to the ground electrode 14. The through vias 33a, 33b, 33c, 34a, 34b, 34c are wires for providing a ground voltage from the outside of the electrostatic micro relay 101 to the ground electrode 13 or the ground electrode 14.

The through vias 35a, 35b are electrically connected respectively to the electrodes 15a, 15b of the fixed electrode 15. Similarly, the through vias 36a, 36b are electrically connected respectively to the electrodes 16a, 16b of the fixed electrode 16. The through vias 35a, 35b, 36a, 36b are wires for providing a voltage from the outside of the electrostatic micro relay 101 to the fixed electrode 15 or the fixed electrode 16.

The sealing material 38 is arranged so as to surround a plurality of through vias. The cavities 39a, 39b are held in an airtight state by the sealing material 38. By such a structure, it is possible to prevent entry of dust, moisture or the like into the cavities 39a, 39b from the outside of the electrostatic micro relay 101. Hence it is possible to enhance the reliability of the electrostatic micro relay 101.

Next, driving of the actuator 25 will be representatively described, thereby to describe the operation of the electrostatic micro relay 101. Since driving of the actuator 26 is similar to what will be described below, the description thereof will not be repeated.

First, it is assumed that a voltage is not applied to the fixed electrode 15. In this case, the fixed electrode 15 and the actuator 25 are in the state of being separated from each other. Therefore, the fixed contact 11a and the movable contact 21a are separated from each other. That is, the switch is in the off-state.

Next, a voltage is applied to the fixed electrode 15 (electrodes 15a, 15b) from the outside of the electrostatic micro relay 101 through the external electrodes 45a, 45b and the through vias 35a, 35b. This leads to generation of electrostatic attraction between the fixed electrode 15 and the actuator 25. By the electrostatic attraction, the actuator 25 comes close to the fixed electrode 15 and the movable contact 21a comes into contact with the fixed contact 11a. This brings the switch into the on-state.

Even after the movable contact 21a has come into contact with the fixed contact 11a, the actuator 25 keeps moving until it comes into contact with the fixed electrode 15. The actuator 25 has the double-supported beam structure. With the beams in a bent state, the movable contact 21a is pressed onto the fixed contact 11a.

Subsequently, the application of the voltage to the fixed electrode 15 is completed. By the actuator 25 being separated from the fixed electrode 15, the movable contact 21a is separated from the fixed contact 11a. This brings the switch into the off-state.

By the electrostatic micro relay 101 being turned on, the signal can be transmitted on the signal line 1. The signal line is formed of metal with low resistance. Hence loss (insertion loss) of the electrostatic micro relay 101 at the time of being turned on can be made small as compared to that of a semiconductor switch. On the other hand, at the time of the electrostatic micro relay 101 being turned off, the movable contact is physically separated from the fixed contact. Hence it is possible to obtain high isolation.

As thus described above, in the first embodiment, the signal input portion is the through via 31 formed in the cap 30. The signal input portion is connected to the input point (pad 51) of the signal line 1. The length of the signal line 11 from the connection point to the fixed contact 11a is substantially equal to the length of the signal line 12 from the connection point to the fixed contact 12a. That is, the signal input portion is connected to the median point of the signal line. By such a configuration, it is possible to realize an electrostatic micro relay excellent in high-frequency characteristics. The reason for this will be described while comparing the electrostatic micro relay according to the first embodiment with its comparative example.

Configuration of Comparative Example

Figure 5:
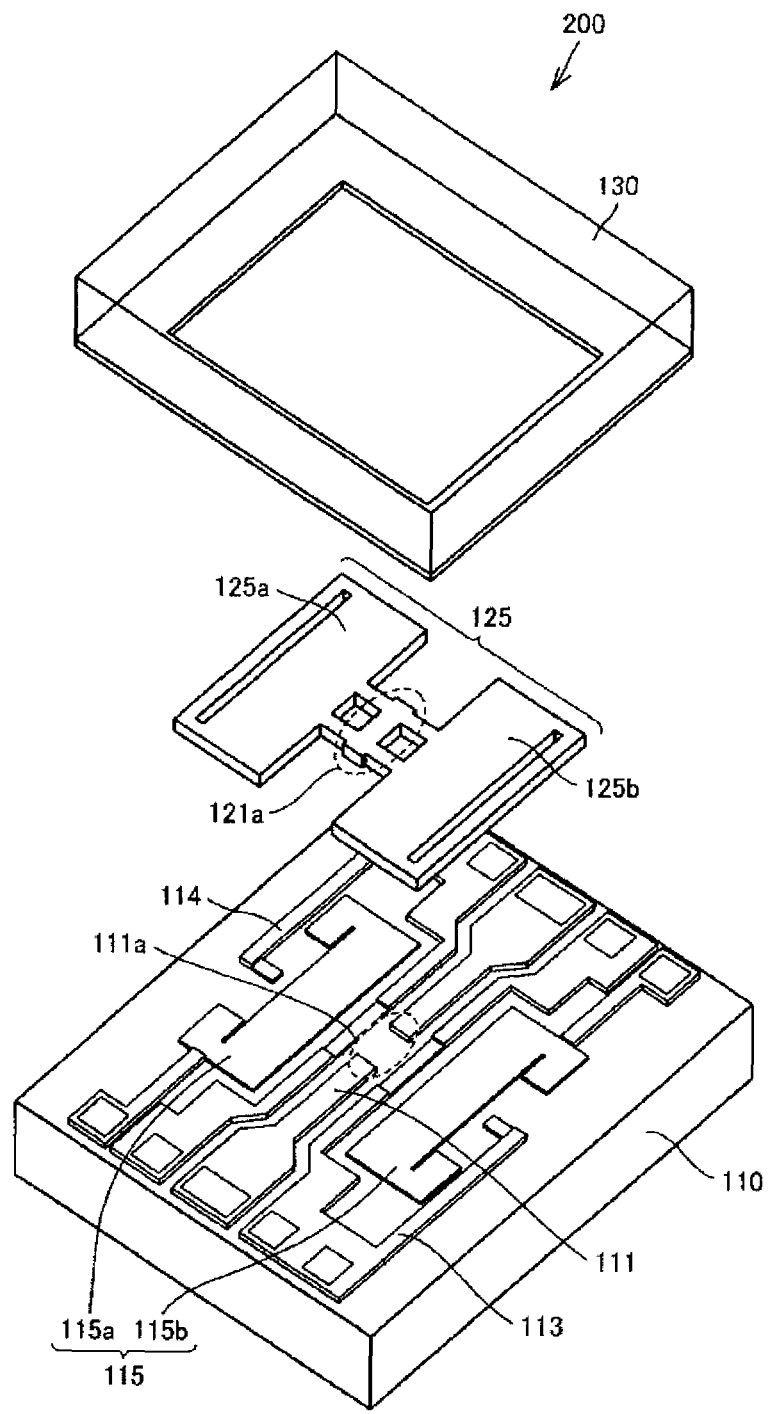
FIG. 5 is an exploded perspective view of a comparative example of the electrostatic micro relay according to the first embodiment.
Figure 6:
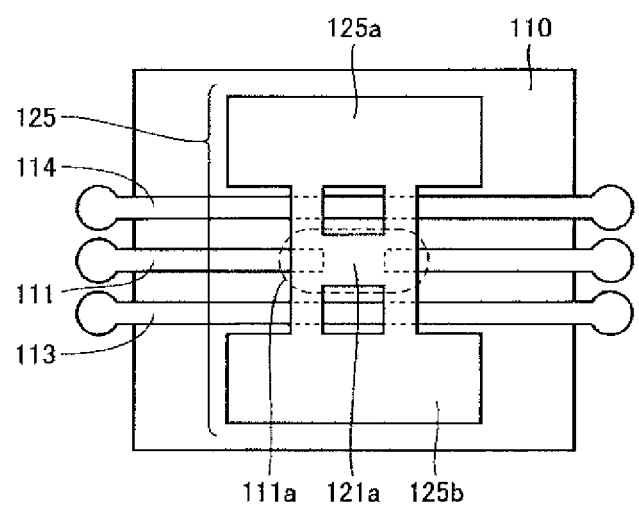
FIG. 6 is a plan view schematically showing the electrostatic micro relay shown in FIG. 5.

FIG. 5 is an exploded perspective view of the comparative example of the electrostatic micro relay according to the first embodiment. FIG. 6 is a plan view schematically showing the electrostatic micro relay shown in FIG. 5. Referring to FIGS. 5 and 6, an electrostatic micro relay 200 as the comparative example has a configuration equivalent to that of an SPST (Single Pole Single Throw) switch. The electrostatic micro relay 200 includes a substrate 110, a signal line 111, ground electrodes 113, 114, a fixed electrode 115, an actuator 125, and a cap 130. The signal line 111, the ground electrodes 113, 114 and the fixed electrode 115 are arranged on one surface of the substrate 110. The signal line 111 has a fixed contact 111a. One end of the signal line 111 corresponds to the signal input portion, and the other end of the signal line 111 corresponds to the signal output portion. The ground electrodes 113, 114 constitute a coplanar waveguide along with the signal line 111.

The fixed electrode 115 includes electrodes 115a, 115b. The actuator 125 includes electrodes 125a, 125b. The movable contact 121a is connected between the electrodes 125a and 125b. The cap 130 is bonded with the substrate 110. The cap 130 is formed with a space for housing the actuator 125.

Figure 7:
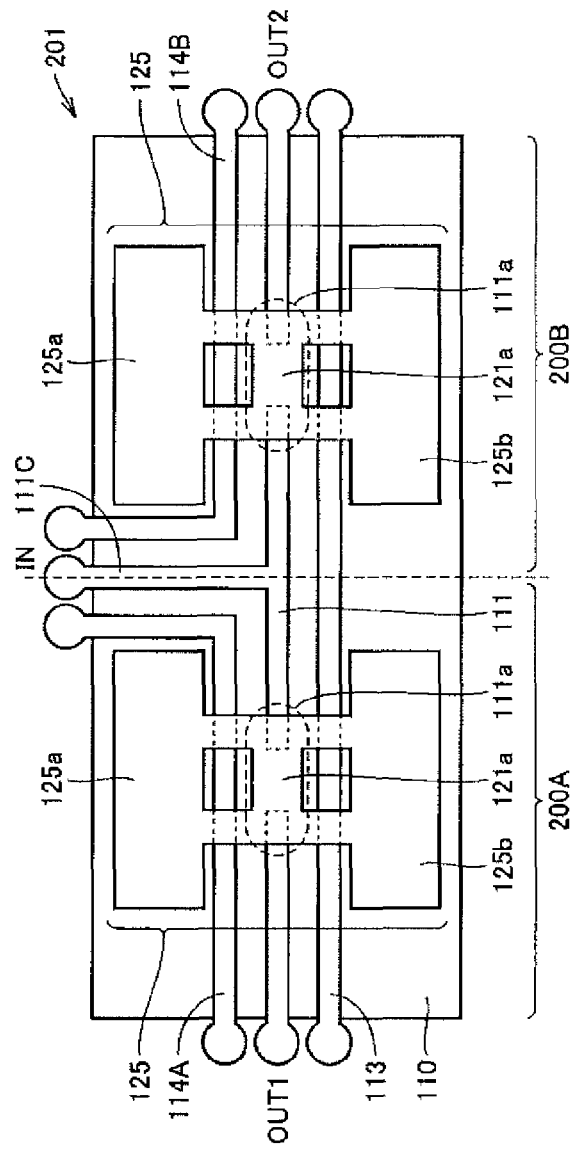
FIG. 7 is a plan view schematically showing a configuration of an SPDT switch configured of the electrostatic micro relay shown in FIGS. 5 and 6.

FIG. 7 is a plan view schematically showing a configuration of an SPDT switch configured of the electrostatic micro relay 200 shown in FIGS. 5 and 6. Referring to FIG. 7, an electrostatic micro relay 201 has a configuration equivalent to that of an SPDT switch including electrostatic micro relays 200A, 200B. The electrostatic micro relays 200A, 200B each have the same configuration as that of the configuration of the electrostatic micro relay 200. Hence in FIG. 7, an identical or corresponding element to the constitutional element of the electrostatic micro relay 200 is provided with an identical or similar reference numeral.

A signal line 111C serves as the signal input portion. The signal line 111C is a signal line extracted from a median point of the signal line 111 to a periphery of the electrostatic micro relay 201 along the substrate surface.

A coplanar waveguide is formed on the surface of the substrate 110. That is, ground electrodes 113, 114A or ground electrodes 113, 114B are arranged on each side of the signal line 111. The ground electrodes 114A, 114B are arranged on the surface of the substrate 110 so as to sandwich the signal line 111C.

Figure 8:
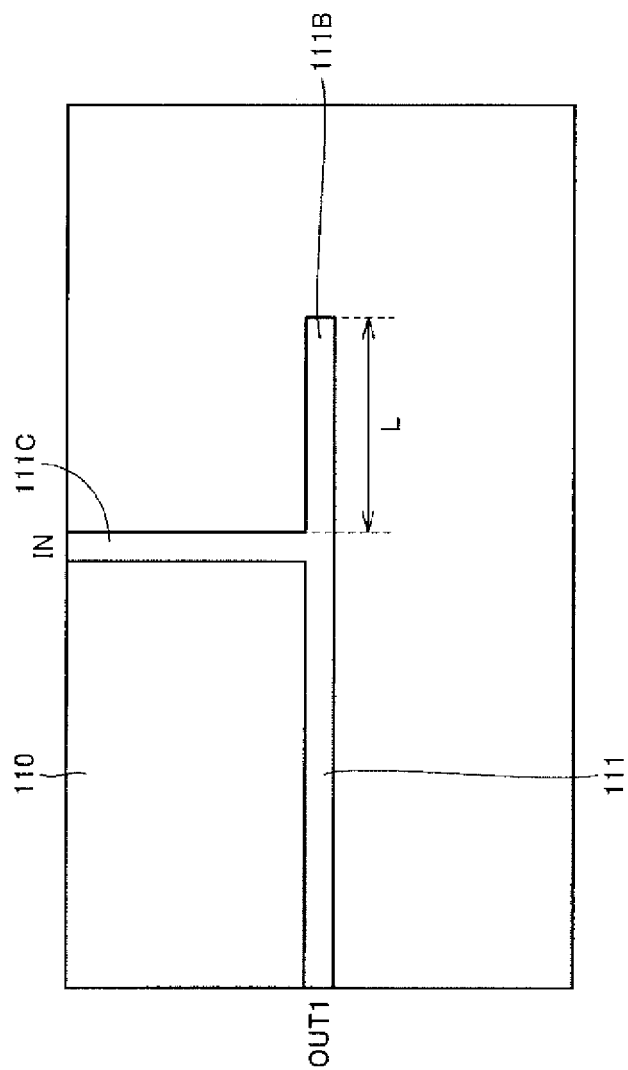
FIG. 8 is a view equivalently showing a signal channel at the time when electrostatic micro relays shown in FIG. 7 are respectively in an on-state and an off-state.

FIG. 8 is a view equivalently showing a signal channel at the time when the electrostatic micro relays 200A, 200B shown in FIG. 7 are respectively in the on-state and the off-state. Referring to FIG. 8, a signal line 111B is a section from the connection point of the signal line 111 and the signal line 111C to the fixed contact 111a of the electrostatic micro relay 200B.

The signal line 111B is equivalent to the stub. When a length of the signal line 111B is referred to as L, in the case of the length L being equal to a quarter of a wavelength of a signal to be transmitted on the signal line, transmission of the signal is cut off by the signal line 111B (stub). That is, insertion loss of the electrostatic micro relay 201 increases in a frequency corresponding to that wavelength.

By making the length of the stub small, the electrostatic micro relay 201 can be used in a higher frequency domain. According to the configuration shown in FIG. 7, the signal line 111C has been extracted from the signal line 111 to the periphery of the substrate 110. Further, both sides of the signal line 111C are formed with the ground electrodes 114A, 114B. When the length of the stub is made small, the two actuators 125 are arranged close to each other. However, when the actuator 125 comes into contact with the fixed electrode 115, it is considered possible that the actuator 125 comes into contact with the ground electrode 114A or 114B (section along the signal line 111C) or comes into contact with the signal line 111C. When the section of the ground electrode 114A or 114B along the signal line 111C is omitted for avoiding the contact between the actuator and the ground electrode (114A or 114B), it is considered possible that characteristics deteriorate causing, for example, impedance mismatching.

Figure 9:
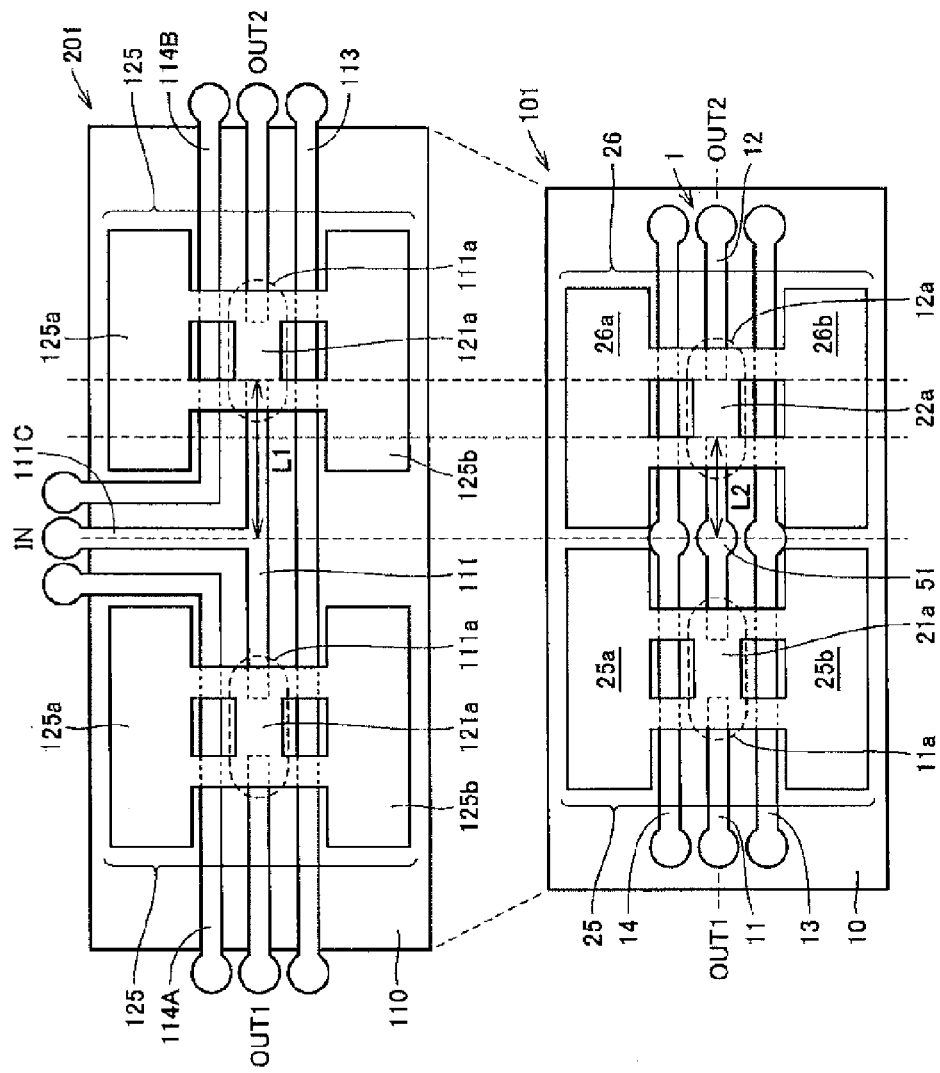
FIG. 9 is a comparative view of the electrostatic micro relay according to the comparative example shown in FIG. 7 and that according to the first embodiment.

Comparison of Comparative Example with One or More Embodiments of Present Invention FIG. 9 is a comparative view of the electrostatic micro relay according to the comparative example shown in FIG. 7 with that according to the first embodiment. Referring to FIG. 9, symbol L1 denotes the length of the stub in the comparative example (electrostatic micro relay 201). Symbol L2 denotes the length of the stub in the electrostatic micro relay 101 according to the first embodiment.

As described above, in the electrostatic micro relay 201, the signal line 111C has been extracted from the median point of the signal line 111 to the periphery of the substrate 110 along the surface of the substrate 110. Due to such a configuration, the ground electrodes 114A, 114B are also formed so as to be bent along the signal lines 111, 111C.

The length L1 of the stub includes a space between the wires and widths of the wires. Specifically, the length L1 of the stub can be estimated to be not larger than: (½ of width of signal line 111C)+(space between signal line 111C and ground electrode 114B)+(width of ground electrode 114B)+(width of actuator 125×½).

As opposed to this, in the electrostatic micro relay 101 according to the first embodiment, a signal is inputted into the pad 51 from the through via (through via 31 shown in FIG. 1 and the like) as the signal input portion, and the signal is then distributed to the signal lines 11, 12. The length L2 of the stub is not larger than: (diameter of pad 51×½)+(width of actuator 126×½). That is, the length L2 of the stub does not include (½ of width of signal line 111C), (space between signal line 111C and ground electrode 114B) and (width of ground electrode 114B). Therefore, according to the first embodiment, the length of the stub can be made small. Further, according to the first embodiment, since the wire extracted from the median point of the signal line to the periphery of the substrate along the surface of the substrate and the wires arranged on both sides of that wire can be omitted, it is possible to bring the two actuators closer to each other. The electrostatic micro relay can thus be made small in size.

Figures 10A, 10B:
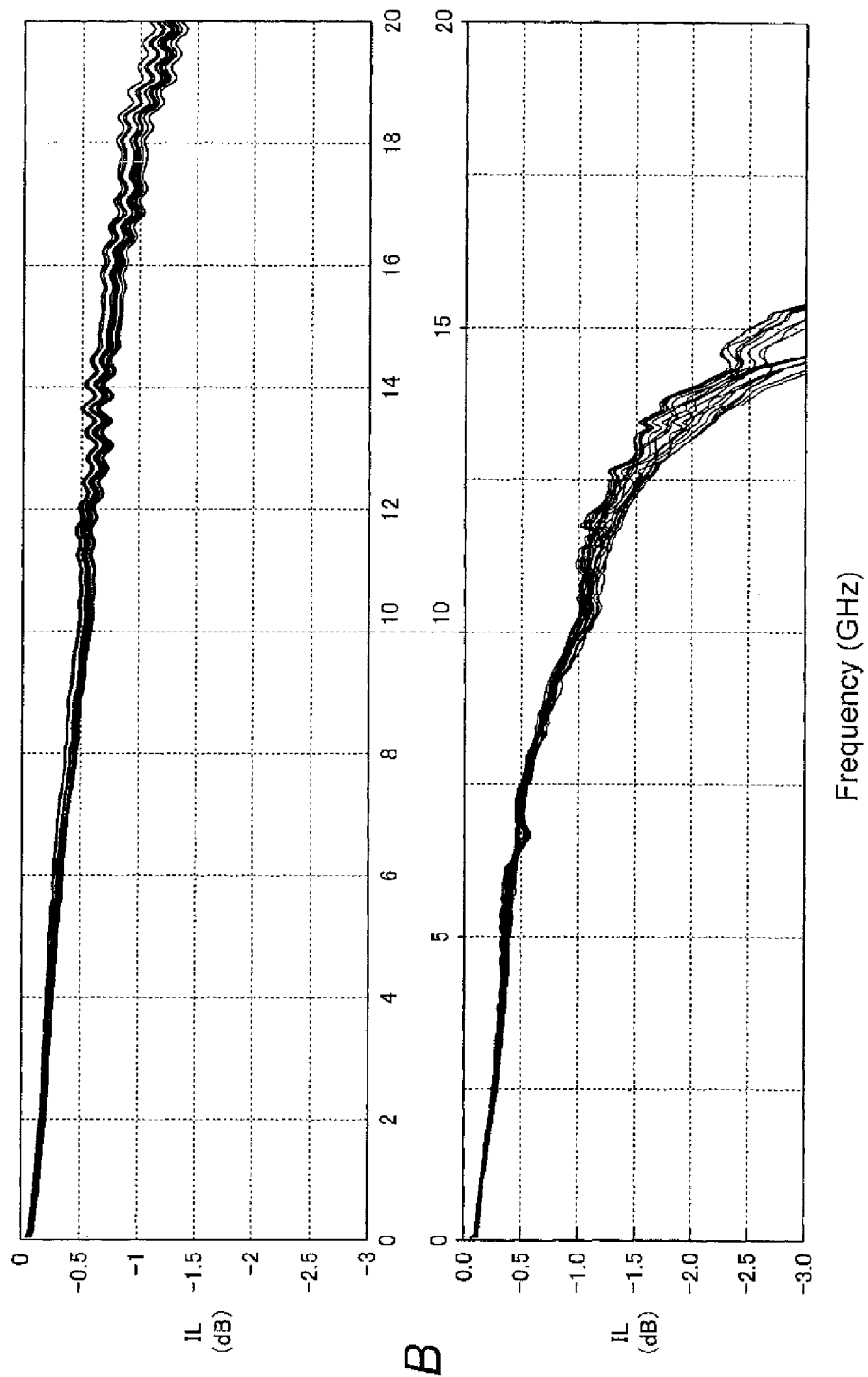
FIGS. 10A and 10B are diagrams comparing insertion loss of the electrostatic micro relay according to the first embodiment and insertion loss of a structure having an equivalent stub length to that in the schematic view shown in FIG. 7.

FIGS. 10A and 10B are diagrams comparing insertion loss of the electrostatic micro relay according to the first embodiment and insertion loss of a structure having an equivalent stub length to that in the schematic view shown in FIG. 7. FIG. 10A is a diagram showing an example of insertion loss (denoted as "IL" in the figure) of the electrostatic micro relay 101 according to the first embodiment. FIG. 10B is a diagram showing an example of insertion loss of the comparative example (electrostatic micro relay 201). In each of the graphs shown in FIGS. 10A and 10B, the insertion loss is expressed by a negative value. The larger the absolute value of the negative value is, the larger the insertion loss is.

In terms of a frequency where the insertion loss is −1.0 dB, a comparison is made between FIGS. 10A and 10B. According to the first embodiment, the frequency where the insertion loss is −1.0 dB is about 18 GHz (cf. FIG. 10A). Meanwhile, in the configuration of comparative example (electrostatic micro relay 201), the frequency where the insertion loss is −1.0 dB is about 10 GHz (cf. FIG. 10B). It is thus understood that the electrostatic micro relay 101 according to the first embodiment has realized low insertion loss in a wide frequency band as compared to the comparative example. The reason why such an effect can be obtained is that in the first embodiment, the length of the stub can be made small by using the through via for the signal input portion as described above.

Further, in the first embodiment, the length of the stub, namely the length of the signal line 11 from the input point to the fixed contact 11a, or the length of the signal line 12 from the input point to the fixed contact 12a, is set to the shortest distance. Accordingly, insertion loss in higher frequency can be made small.

Moreover, in the first embodiment, the signal input portion is connected to the input point (pad 51) of the signal line 1. The length of the signal line 11 from the connection point to the fixed contact 11a is substantially equal to the length of the signal line 12 from the connection point to the fixed contact 12a. Accordingly the two stubs have equal lengths, and even when either of the two actuators is driven, the frequency where the insertion loss is −1.0 dB is substantially unchanged. That is, according to the first embodiment, it is possible to realize an electrostatic micro relay with stable characteristics.

Figure 11:
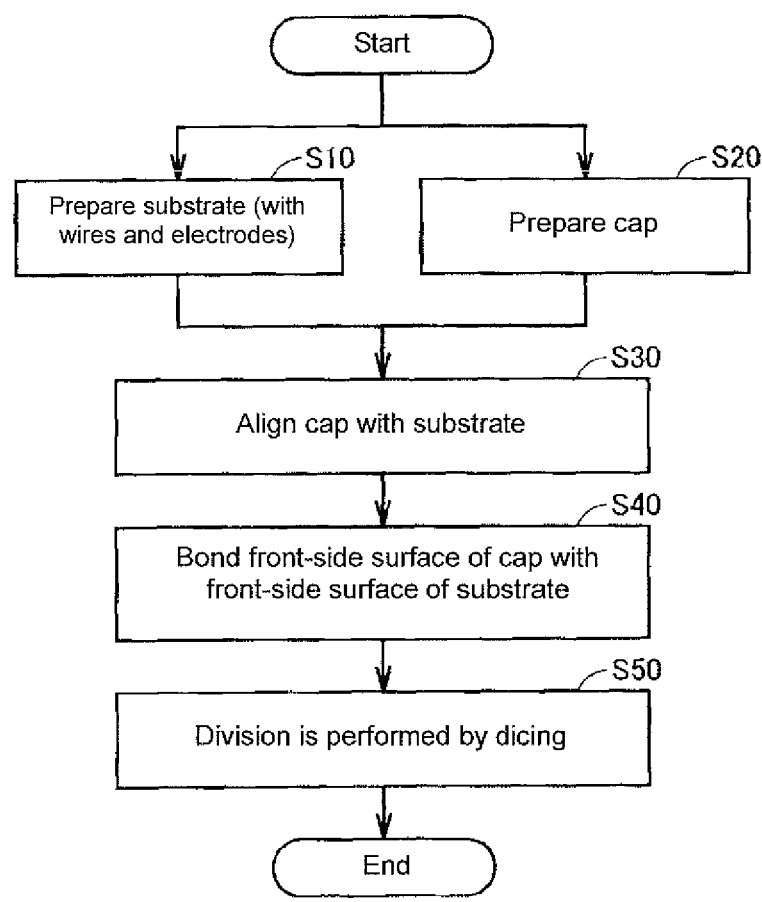
FIG. 11 is a flowchart schematically showing a manufacturing flow of the electrostatic micro relay according to the first embodiment.

Subsequently, a manufacturing method for the electrostatic micro relay according to the first embodiment will be described. FIG. 11 is a flowchart schematically showing a manufacturing flow of the electrostatic micro relay according to the first embodiment.

Referring to FIG. 11, in Step S10, a substrate formed with wires and electrodes (fixed electrodes and actuators) is prepared. The substrate is, for example, in the form of a wafer formed with an electrode pattern corresponding to an individual electrostatic micro relay.

In Step S20, a cap formed with through vias is prepared. The cap is, for example, a glass wafer previously formed with through vias.

In FIG. 11, processes shown in Steps S10 and S20 are executed in parallel. However, the processes of Steps S10 and S20 may be sequentially executed. In that case, the sequence of the processes is not particularly restricted.

In Step S30, the cap 30 is aligned with the substrate 10. In Step S40, the front side-surface of the cap 30 is bonded with the front side-surface of the substrate 10. The front side-surface of the substrate 10 is the surface formed with the wires and the electrodes. The front side-surface of the cap 30 is the surface formed with internal electrodes which will be connected with the wires or the electrodes. In Step S50, division is performed by dicing to make electrostatic micro relays.

Figure 12:
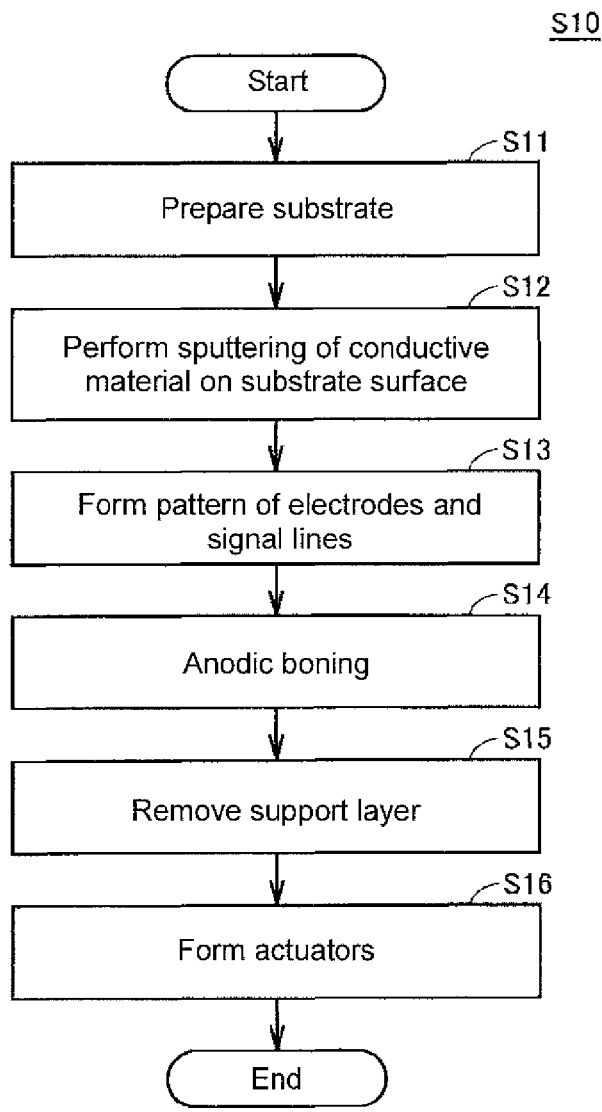
FIG. 12 is a flowchart for explaining in detail a process of Step S10 shown in FIG. 11.

FIG. 12 is a flowchart for explaining in detail the process of Step S10 shown in FIG. 11. Referring to FIG. 12, the process of Step S10 is made up of Steps S11 to S16. The process of each step will be described in more detail while referring to the cross section of the substrate.

Figure 13:
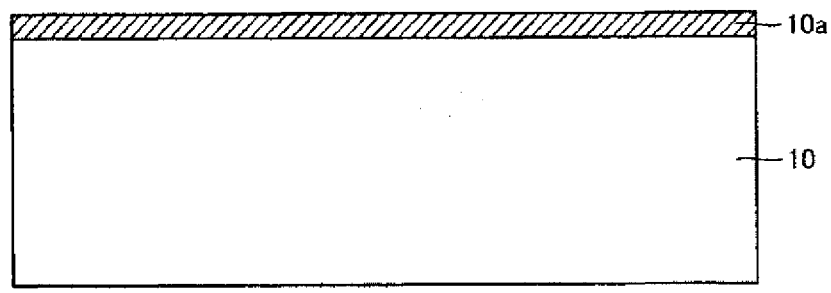
FIG. 13 is a view for explaining processes of Steps S11 and S12 shown in FIG. 12.

FIG. 13 is a view for explaining the processes of Steps S11 and S12 shown in FIG. 12. Referring to FIGS. 12 and 13, the substrate 10 is prepared in Step S11. As described above, for example, a glass substrate is prepared as the substrate 10. In Step S12, a conductive material 10a is vapor-deposited on one surface of the substrate 10 by sputtering.

Figure 14:
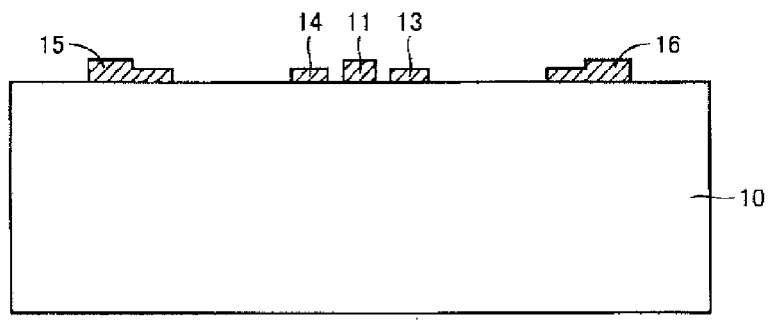
FIG. 14 is a view for explaining a process of Step S13 shown in FIG. 12.

FIG. 14 is a view for explaining the process of Step S13 shown in FIG. 12. Referring to FIGS. 12 and 14, in Step S13, a pattern of the electrodes and the signal lines is formed. The pattern of the electrodes and the signal lines is formed by using known techniques in manufacturing a variety of semiconductor elements, such as photolithography and dry etching, and hence a detailed description is not repeated here. FIG. 14 representatively shows the fixed electrodes 15, 16, the signal line 11, and the ground electrodes 13, 14.

Figure 15:
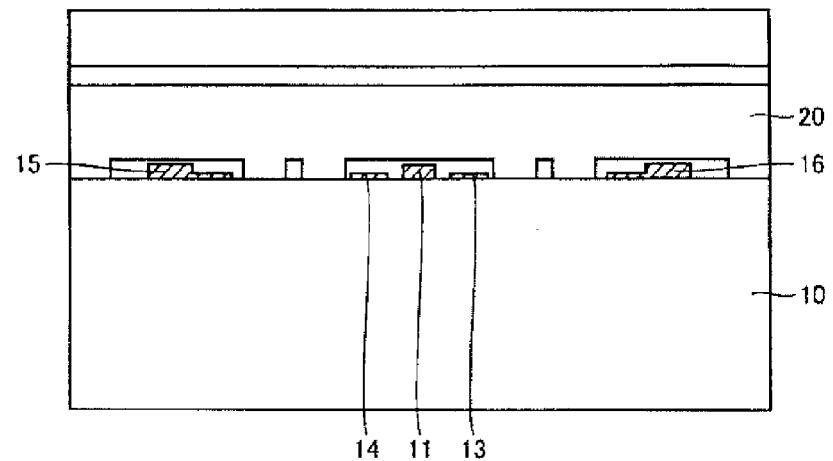
FIG. 15 is a view for explaining a process of Step S14 shown in FIG. 12.

FIG. 15 is a view for explaining the process of Step S14 shown in FIG. 12. Referring to FIGS. 12 and 15, in Step S15, a silicon wafer 20 is anodically bonded to the surface of the substrate 10 formed with the electrodes and the like. The surface of the silicon wafer 20, which is on the side to be joined with the substrate 10, is formed with a structure to be later left as the actuators 25, 26. The silicon wafer 20 is an SOI (Silicon On Insulator) wafer in one example, e.g., a wafer formed by pasting two silicon substrates by a silicon oxide film. One wafer out of the two silicon substrates is formed with the pattern of the actuators. The other wafer serves to support the wafer formed with the pattern.

Figure 16:
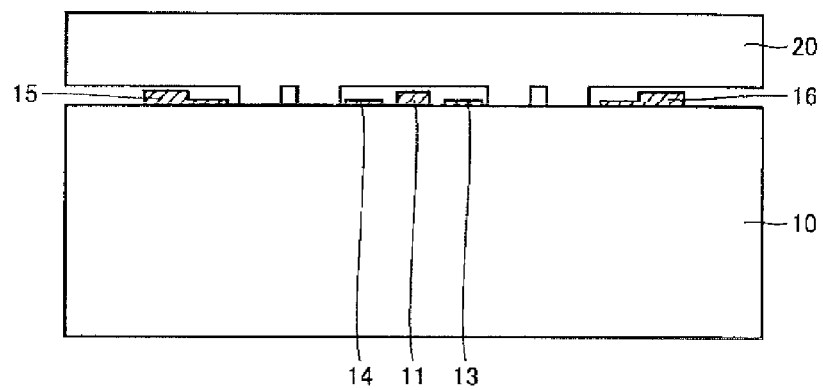
FIG. 16 is a view for explaining a process of Step S15 shown in FIG. 12.

FIG. 16 is a view for explaining the process of Step S15 shown in FIG. 12. Referring to FIGS. 12 and 16, in Step S15, a support layer of the silicon wafer 20 is removed. That is, the wafer for supporting the wafer formed with the pattern of the actuators and the silicon oxide film located between the two wafers are removed.

Figure 17:
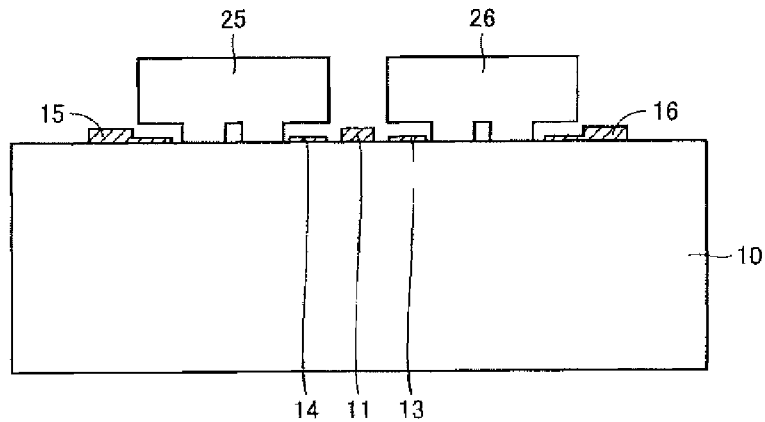
FIG. 17 is a view for explaining a process of Step S16 shown in FIG. 12.

FIG. 17 is a view for explaining the process of Step S16 shown in FIG. 12. Referring to FIGS. 12 and 17, in Step S16, the actuators 25, 26 are formed by processing the silicon wafer 20. Also in the processing of the silicon wafer 20, the formation is performed by using the known techniques in manufacturing a variety of semiconductor elements, such as photolithography and dry etching, and hence the detailed description is not repeated here. By the foregoing series of processes, the substrate formed with the wires and electrodes are prepared.

Figure 18:
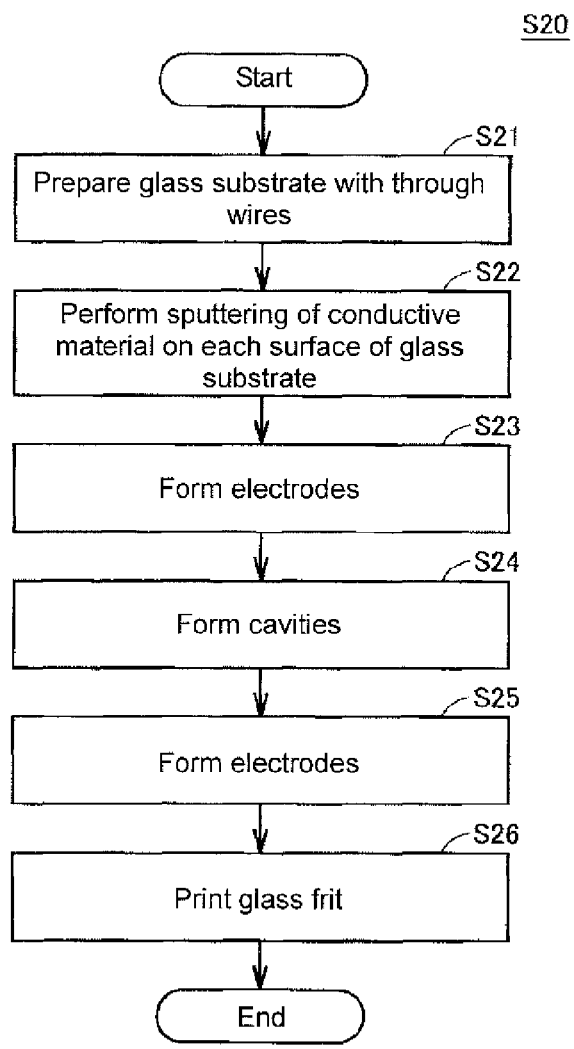
FIG. 18 is a flowchart for explaining in detail a process of Step S20 shown in FIG. 11.

FIG. 18 is a flowchart for explaining in detail the process of Step S20 shown in FIG. 11. Referring to FIG. 18, the process of Step S20 is made up of Steps S21 to S26. The process of each step will be described in more detail while referring to the cross section of the glass substrate for forming the cap.

Figure 19:
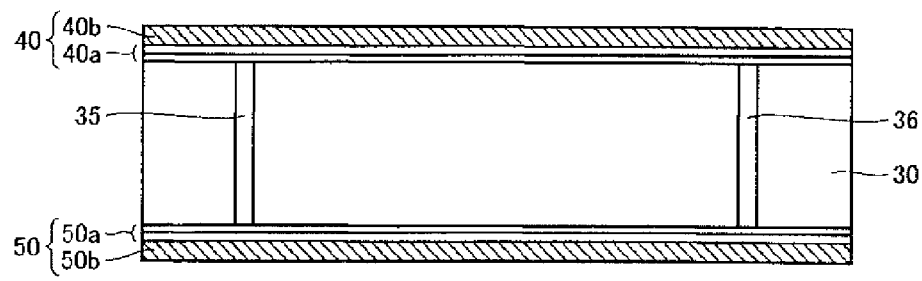
FIG. 19 is a view for explaining processes of Steps S21 and S22 shown in FIG. 18.

FIG. 19 is a view for explaining the processes of Steps S21 and S22 shown in FIG. 18. Referring to FIGS. 18 and 19, in Step S21, a glass substrate with through vias is prepared for forming the cap 30. FIG. 19 representatively shows the through vias 35, 36. In Step S22, conductive layers 40, 50 are vapor-deposited on one surface and the other surface of the glass substrate by sputtering.

The conductive layer 40 includes an adhesion layer 40a and a surface layer 40b. The conductive layer 50 includes an adhesion layer 50a and a surface layer 50b. The adhesion layers 40a, 50a are, for example, layers of chrome (Cr). The surface layers 40b, 50b are, for example, layers of gold (Au). The conductive layer 40 is a conductive film for later forming the external electrodes. The conductive layer 50 is a conductive film for the internal electrodes to be later connected to the electrodes, the signal line or the like on the substrate 10.

Figure 20:
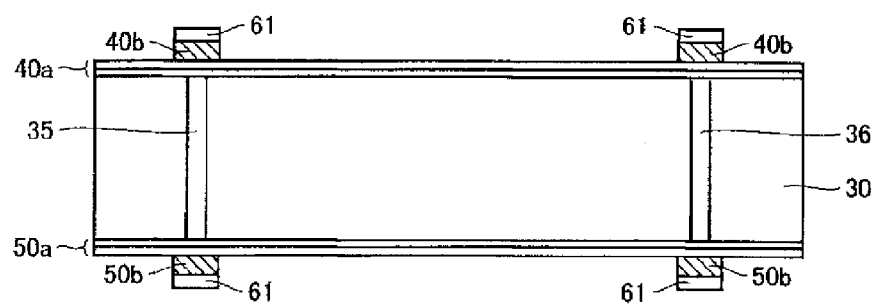
FIG. 20 is a view for explaining a process of Step S23 shown in FIG. 18.

FIG. 20 is a view for explaining the process of Step S23 shown in FIG. 18. Referring to FIGS. 18 and 20, in Step S23, the electrodes are formed by patterning the surface layers 40b, 50b. In the patterning of the surface layers 40b, 50b, the formation is performed by using the known techniques in manufacturing a variety of semiconductor elements, such as photolithography and dry etching, and hence the detailed description is not repeated here. The pattern of the electrodes is formed by a photoresist 61, and the surface layers 40b, 50b other than sections of that pattern is removed by etching.

Figure 21:
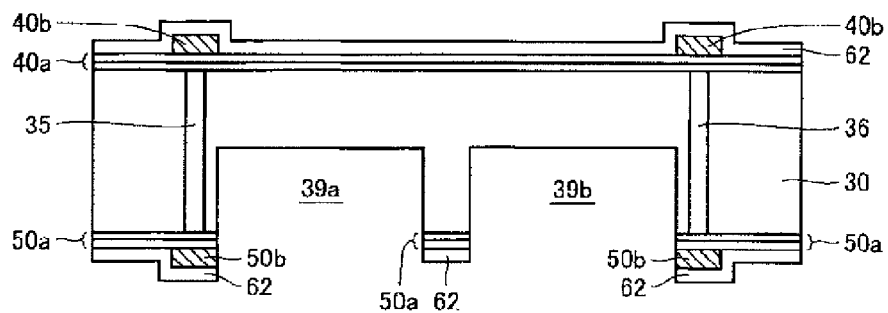
FIG. 21 is a view for explaining a process of Step S24 shown in FIG. 18.

FIG. 21 is a view for explaining the process of Step S24 shown in FIG. 18. Referring to FIGS. 18 and 21, in Step S24, recessed portions corresponding to the cavities 39a, 39b are formed in the glass substrate. An opening pattern is formed by a photoresist 62. The opening pattern is etched, thereby to form the cavities 39a, 39b.

Figure 22:
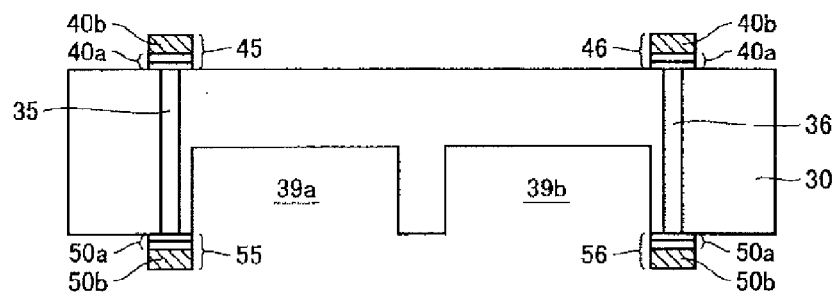
FIG. 22 is a view for explaining a process of Step S25 shown in FIG. 18.

FIG. 22 is a view for explaining the process of Step S25 shown in FIG. 18. Referring to FIGS. 18 and 22, in Step S25, the electrodes are formed by patterning the adhesion layers 40a, 50a. The adhesion layers 40a, 50a are patterned as in the process of Step S23 (cf. FIG. 20). Thereby, the external electrode and the internal electrode, which are connected to the through via, are connected to each other. FIG. 22 shows an external electrode 45 and an internal electrode 55 which are connected to a through via 35, and an external electrode 46 and an internal electrode 56 which are connected to a through via 36.

Figure 23:
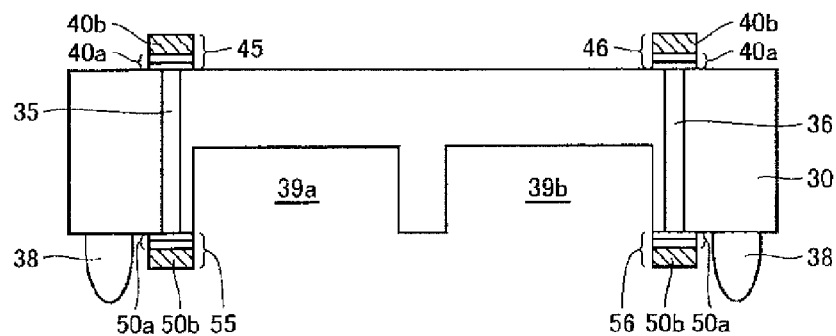
FIG. 23 is a view for explaining a process of Step S26 shown in FIG. 18.

FIG. 23 is a view for explaining the process of Step S26 shown in FIG. 18. Referring to FIGS. 18 and 23, in Step S26, glass frit as the sealing material 38 is applied by printing onto the surface of the glass substrate on the side formed with the cavities 39a, 39b. As shown in FIG. 23, the sealing material 38 (glass frit) is printed outside the through vias 35, 36. Therefore, as shown in FIG. 2, the sealing material 38 (glass frit) is provided on the surface of the glass substrate so as to surround a plurality of through vias.

Figure 24:
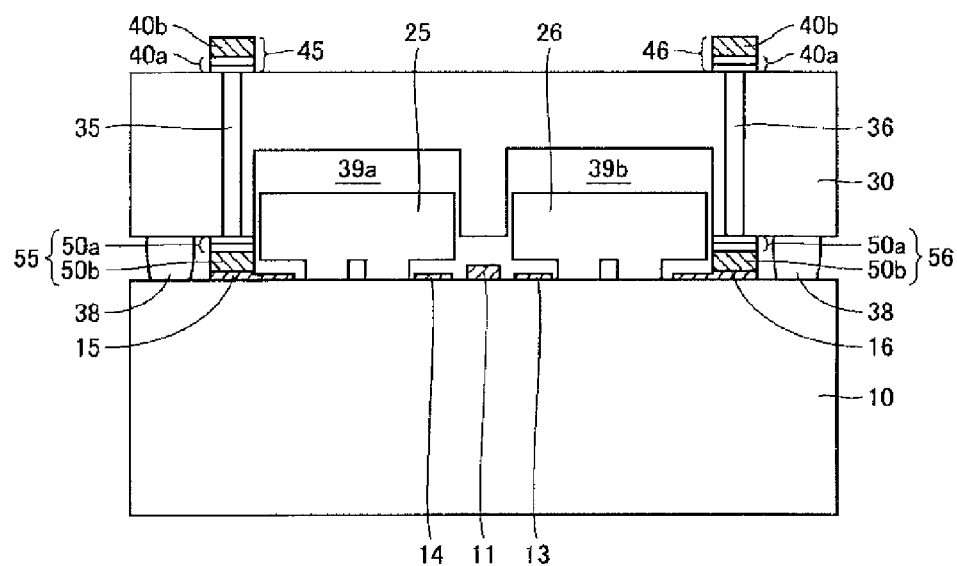
FIG. 24 is a view for explaining processes of Steps S30 and S40 of FIG. 11.

FIG. 24 is a view for explaining the processes of Steps S30 and S40 of FIG. 11. Referring to FIG. 24, the substrate 10 is aligned with the cap 30, and the electrodes on the cap 30 side are aligned with the electrodes or the signal line on the substrate 10. In this state, the substrate 10 is press-bonded with the cap 30. Thereby, the through via 31 (cf. FIG. 1) as the signal input portion is connected to the pad 51 (cf. FIG. 1) as the input point of the signal line 1. Thereafter, division is performed to form the electrostatic micro relays according to the first embodiment.

As thus described, according to the first embodiment, the through via as the signal input portion is connected to the input point of the signal line. It is thereby possible to make the stub short, so as to reduce insertion loss in a higher frequency band. Hence it is possible to improve the characteristics of the electrostatic micro relay.

Further, in the case of the electrostatic micro relay 200 having the configuration shown in FIG. 5, the electrode formed on the substrate is extracted out of the airtight space across the sealing material. As opposed to this, according to the first embodiment, the sealing material surrounds the plurality of through vias. Accordingly, the need for ensuring the airtightness in a step portion of the wire can be eliminated by using the sealing material. Hence it is possible to reduce the possibility for deterioration in airtightness due to insufficient sealing in the step portion of the wire.

Further, in the case of realizing an equivalent configuration to that of the SPDT switch by using two electrostatic micro relays 200 having the configuration shown in FIG. 5, a package to house those electrostatic micro relays is required. Here, in the configuration shown in FIG. 5, there is a step between the outside-surface (surface on the opposite side to the opposed surface to the substrate 110) of the cap 130 and the surface of the substrate 110 formed with the electrodes. For this reason, in order to house the two electrostatic micro relays 200 into the package, it is considered that a cavity is formed in the package and the electrostatic micro relay 200 is arranged such that the cap 130 is put into that cavity. In this case, the electrode formed on the package surface is connected with the electrode of the electrostatic micro relay 200. However, this increases manufacturing cost due to the need for preparing the package formed with the cavity. According to the first embodiment, all of the plurality of external electrodes are arranged on the surface (surface on the opposite side to the opposed surface to the substrate 10) of the cap 30 by the through vias. This eliminates the need for preparing the package formed with the cavity as described above. Hence it is possible to achieve reduction in mounting cost.

Embodiment 2

Figure 25:
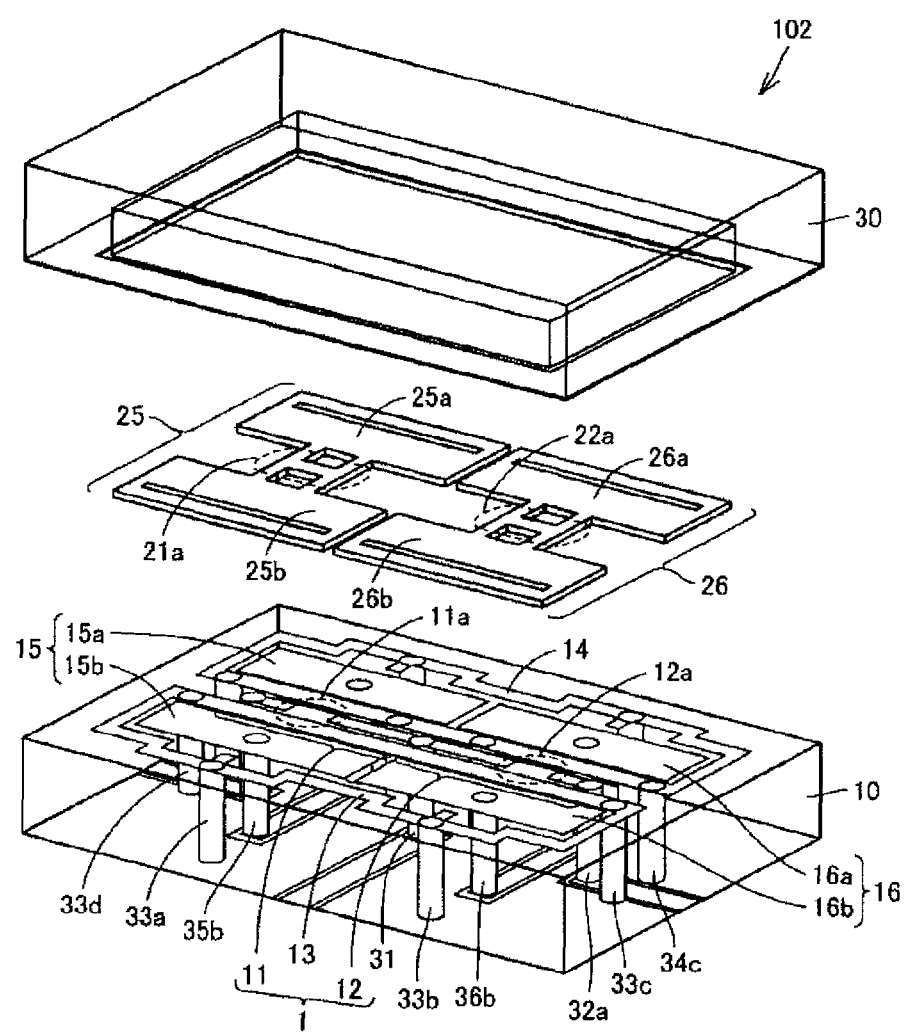
FIG. 25 is an exploded perspective view of an electrostatic micro relay according to a second embodiment of the present invention.
Figure 26:
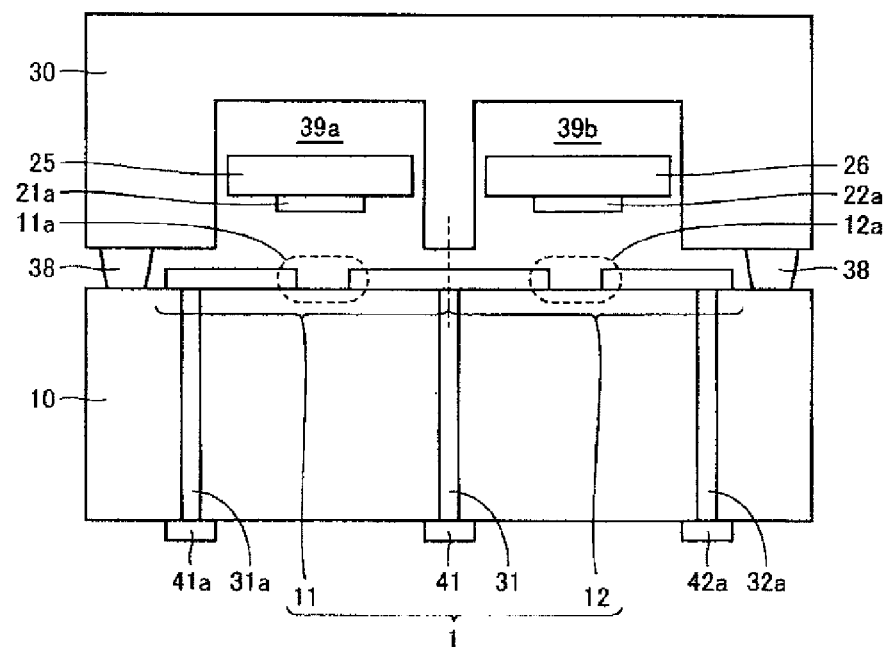
FIG. 26 is a view schematically showing a cross section of the electrostatic micro relay.

FIG. 25 is an exploded perspective view of an electrostatic micro relay 102 according to a second embodiment of the present invention. FIG. 26 is a view schematically showing a cross section of the electrostatic micro relay 102. Referring to FIGS. 25 and 26, the electrostatic micro relay 102 is different from the electrostatic micro relay 101 in that the through vias are formed on the substrate 10 side.

The through via 31 is connected to the input point of the signal line 1, and functions as the signal input portion. The through vias 31a, 32a are electrically connected to the respective ends of the signal lines 11, 12, and function as the signal output portions. The through vias 31, 31a, 32a are respectively connected with the external electrodes 41, 41a, 42a. The external electrodes 41, 41a, 42a are arranged on the surface of the substrate 10 on the opposite side to the surface formed with the signal lines 11, 12. Further, the substrate 10 is arranged with the through vias (e.g., through vias 33a, 33b, 33c, 33d, etc.) which are connected to the ground electrodes 13, 14, and the through vias (e.g. through vias 35b, 36b, etc.) which are connected to the fixed electrodes 15, 16.

The configuration of the other section of the electrostatic micro relay 102 is similar to the configuration of the corresponding portion of the electrostatic micro relay 101 according to the first embodiment. According to the second embodiment, the through via as the signal input portion is connected to connection point of the plurality of signal lines. Therefore, as in the first embodiment, it is possible to reduce insertion loss in a higher frequency band, so as to improve the characteristics of the electrostatic micro relay.

It is to be noted that, basically, the electrostatic micro relay 102 according to the second embodiment can be manufactured following the manufacturing method shown in FIG. 11. For example, Step S11 shown in FIG. 12 may be replaced by Step S21 shown in FIG. 18, and a step of forming the through vias and a step of forming the external electrodes may be added after Step S13. However, the sequence of the step of forming the through vias and the step of forming a pattern of the electrodes and the signal lines is not particularly restricted.

Further, in the second embodiment, the glass substrate to become the cap in the future is formed with no through via and no electrode. Hence in Step S21 shown in FIG. 18, the glass substrate with no through via is prepared. Moreover, the processes of Steps S22, S23 and S25 are omitted.

In one or more of the above embodiments, the electrostatic micro relay having the equivalent configuration to that of the SPDT switch has been shown. That is, the switch provided with two contacts with respect to one signal input portion is shown. However, the configuration of the electrostatic micro relay is not restricted to such a configuration.

Figure 27:
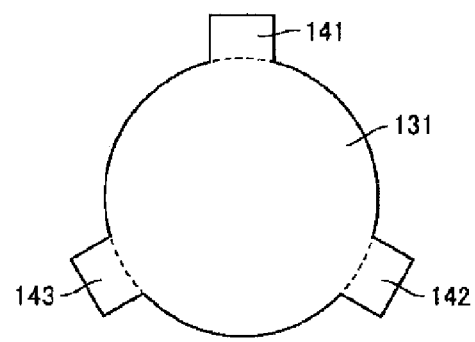
FIG. 27 is a first view schematically showing another constitutional example of the electrostatic micro relay according to one or more embodiments of the present invention.
Figure 28:
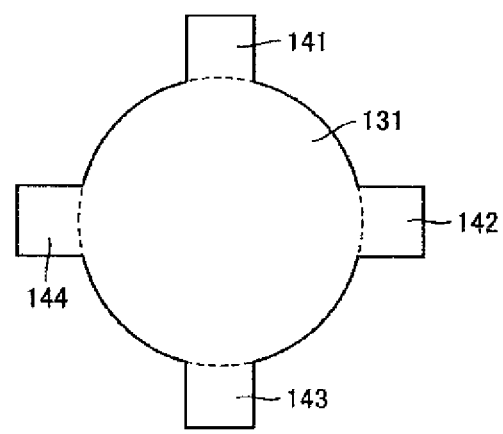
FIG. 28 is a second view schematically showing another constitutional example of the electrostatic micro relay according to one or more embodiments of the present invention.
Figure 29:
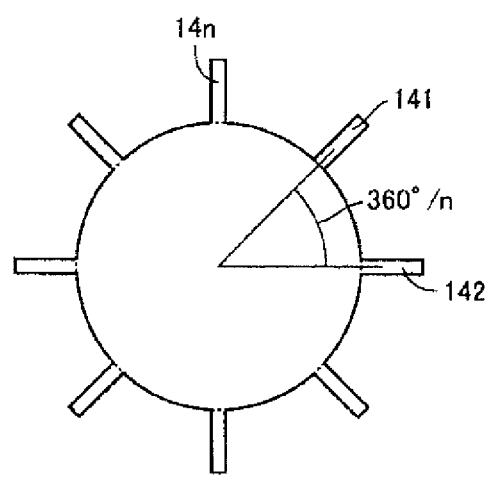
FIG. 29 is a third view schematically showing another constitutional example of the electrostatic micro relay according to one or more embodiments of the present invention.

FIG. 27 is a first view schematically showing another constitutional example of the electrostatic micro relay according to one or more embodiments of the present invention. FIG. 28 is a second view schematically showing another constitutional example of the electrostatic micro relay according to one or more embodiments of the present invention. FIG. 29 is a third view schematically showing another constitutional example of the electrostatic micro relay according to one or more embodiments of the present invention.

Referring to FIGS. 27 to 29, in the first example, three fixed contacts 141 to 143 are provided with respect to the signal input portion 131. In the second example, four fixed contacts 141 to 144 are provided with respect to the signal input portion 131. As thus described, an electrostatic micro relay having n (n is an integer not smaller than 2) fixed contacts 141 to 14n with respect to the signal input portion 131 can be realized in one or more embodiments of the present invention.

It is to be noted that, according to one or more embodiments of the present invention, the length from the signal input portion 131 to each of the plurality of fixed contacts is equal to each other. Accordingly, the length of the stub is substantially unchanged in a state where any fixed contact is selected (any fixed contact is in contact with the movable contact), it is possible to realize an electrostatic micro relay with stable characteristics. Therefore, the n fixed contacts are, for example, arranged radially with respect to the signal input portion.

Further, according to one or more embodiments of the present invention, the length from the signal input portion 131 to each of the plurality of fixed contacts is as small as possible. With such a length, it is possible to suppress insertion loss in higher frequency, so as to realize an electrostatic micro relay excellent in characteristics.

In order that the length from the signal input portion 131 to each of the plurality of fixed contacts is made equal to each other and/or the length from the signal input portion 131 to each of the plurality of fixed contacts is made the shortest, for example as shown in FIG. 29, two adjacent fixed contacts are arranged so as to form an angle of (360°/n) with respect to the center of the signal input portion 131. That is, a plurality of fixed contacts are arranged at equal angles.

By arranging on a plane the plurality of fixed contacts at equal angles with respect to the center of the signal input portion 131, it is possible to lower the possibility that a plurality of actuators respectively corresponding to the plurality of fixed contacts interfere with each other. However, the shortest distance from the input point of a signal to the fixed contact can be set in accordance with the relation of arrangement of the plurality of actuators as described above. For example, as long as the length from the signal input portion 131 to each of the plurality of fixed contacts can be made the shortest by arranging the plurality of actuators so as not to interfere with each other or so as to have the shortest space therebetween, it is not restrictive that two adjacent fixed contacts are arranged so as to form the angle of (360°/n) with respect to the center of the signal input portion 131. For example in the case of n=3, when it is possible to avoid three actuators interfering with each other, a configuration may be adopted where the three fixed contacts 141 to 143 are arranged in directions at 0°, 90° and 180° with respect to the center of the signal input portion 131.

Further, in one or more of the foregoing embodiments, either of two actuators has the double-supported beam structure. However, the structure of the actuators does not need to be restricted to such a structure.

Figure 30:
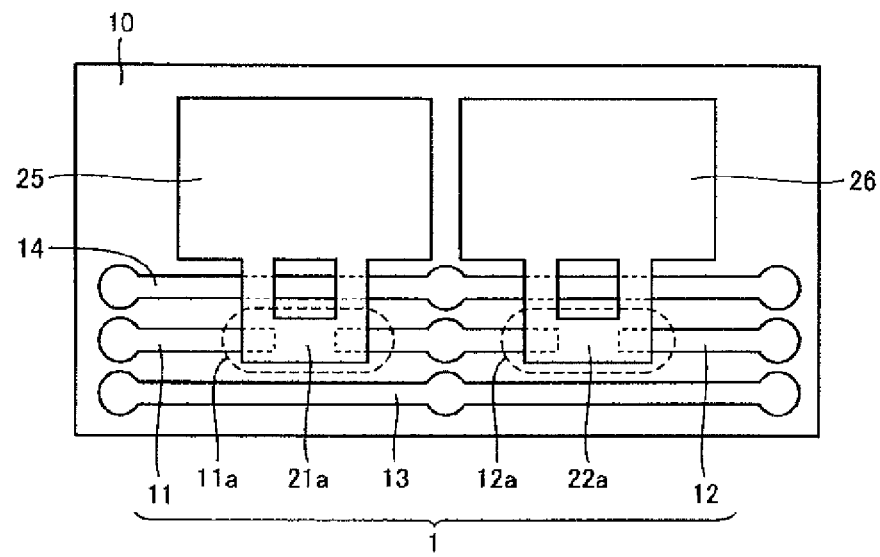
FIG. 30 is a view schematically showing another constitutional example of the actuators in the electrostatic micro relay according to one or more embodiments of the present invention.
Figure 31:
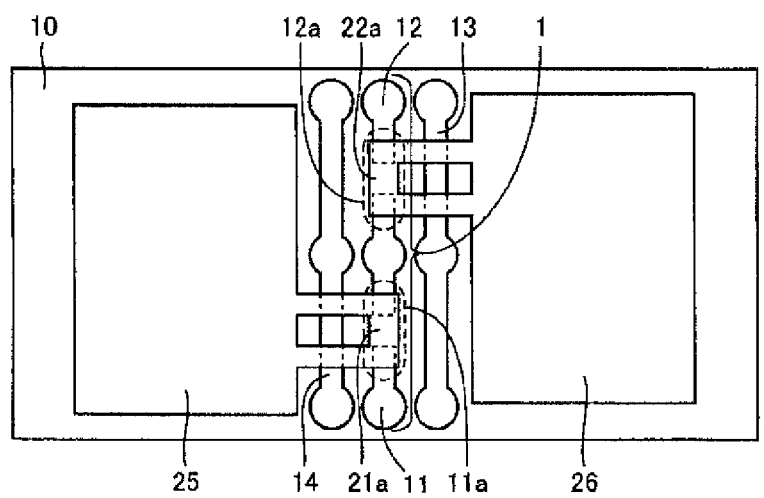
FIG. 31 is a modified example of the configuration shown in FIG. 30.

FIG. 30 is a view schematically showing another constitutional example of the actuators in the electrostatic micro relay according to one or more embodiments of the present invention. FIG. 31 is a modified example of the configuration shown in FIG. 30. Referring to FIGS. 30 and 31, each of the actuators 25, 26 has a single-supported beam structure. Therefore, the fixed electrodes are formed in shapes corresponding to the actuators 25, 26. In FIGS. 30 and 31, there is a difference in arrangement of the actuators 25 and 26. According to this configuration, the electrostatic micro relay can be made smaller in size than the electrostatic micro relays according to above Embodiments 1 and 2.

Figure 32:
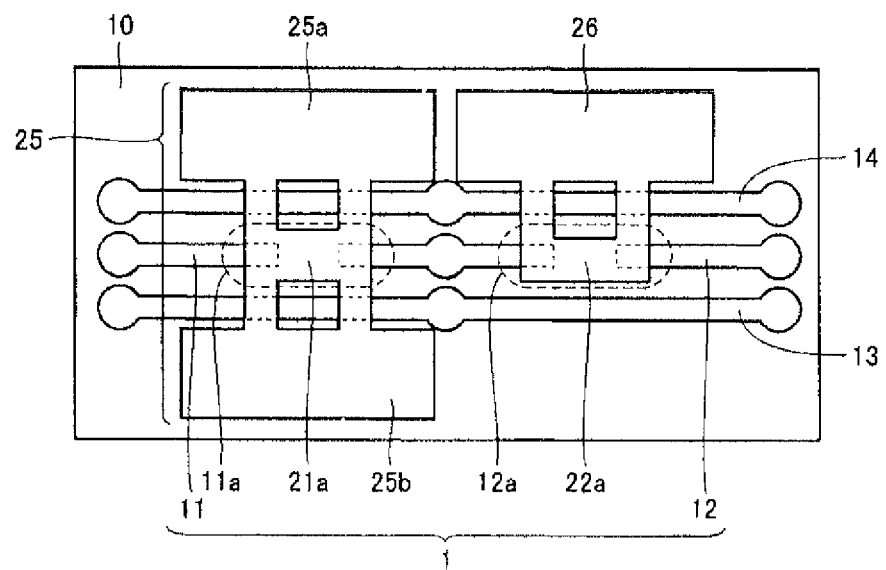
FIG. 32 is a view schematically showing still another constitutional example of the actuators in the electrostatic micro relay according to one or more embodiments of the present invention.
Figure 33:
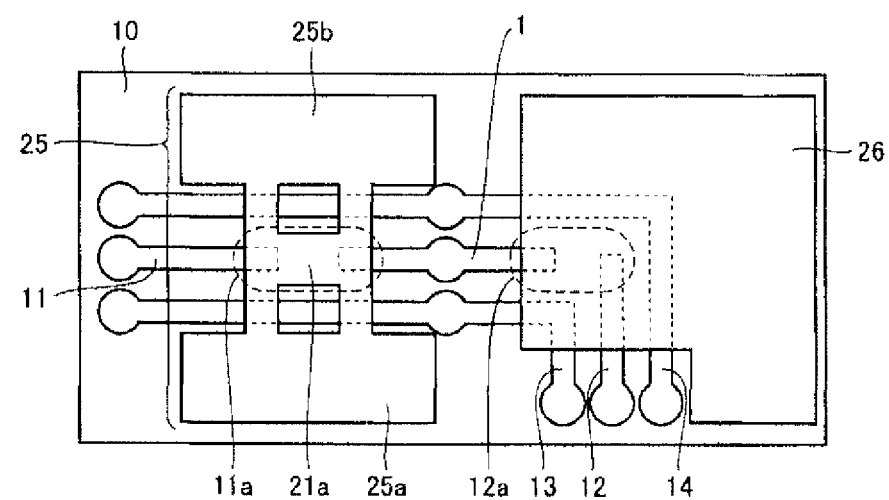
FIG. 33 is a modified example of the configuration shown in FIG. 32.

FIG. 32 is a view schematically showing still another constitutional example of the actuators in the electrostatic micro relay according to one or more embodiments of the present invention. FIG. 33 is a modified example of the configuration shown in FIG. 32. Referring to FIGS. 32 and 33, the actuator 25 has the double-supported beam structure (the movable contact 21a is connected to the electrodes 25a, 25b). As opposed to this, the actuator 26 has the single-supported beam structure. In such a manner, the actuator having the double-supported beam structure may be combined with the actuator having the single-supported beam structure.

Moreover, in one or more of the foregoing embodiments, the form of the coplanar waveguide being formed on the substrate has been shown. However, in place of the coplanar waveguide, another line such as a micro-strip line may be formed on the substrate. In this case, the signal lines 11, 12 are formed on the front-side surface of the substrate 10 and ground electrodes are formed on the rear-side surface of the substrate 10. As in the first embodiment, the signal input portion and the signal output portions are configured by the through vias formed in the cap 30.

The embodiments disclosed herein should be considered as not restrictive but illustrative in all aspects. The scope of the present invention is shown not by the above descriptions but by the claims, and is intended to include all alternations within the meaning and range equivalent to the claims.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electrostatic micro relay, comprising:
a substrate;
a signal line arranged on the substrate and having an input point configured to receive a signal and a plurality of signal channels configured to distribute the signal, the plurality of signal channels being each formed with a fixed contact;
a plurality of movable contacts, each provided with respect to each of the fixed contacts and arranged so as to be opposed to a corresponding fixed contact across a space;
a plurality of movable electrodes, each connected to each of the plurality of movable contacts and configured to make the connected movable contact brought into contact with and separated from the corresponding fixed contact;
a cap, formed with a space configured to house the plurality of movable electrodes, and bonded with the substrate; and
a signal input portion, wherein
the signal input portion includes a through via connected to the input point of the signal line as passing through the cap or the substrate.

2. The electrostatic micro relay according to claim 1, wherein
a length of each of the plurality of signal channels from the input point to the fixed contact is equal to each other.

3. The electrostatic micro relay according to claim 1, wherein
the length of the signal channel from the input point to the fixed contact is the shortest distance defined by arrangement of the plurality of movable electrodes.

4. The electrostatic micro relay according to claim 1, further comprising
a pair of ground conductors arranged on both sides of the signal line on the surface of the substrate.

5. The electrostatic micro relay according to claim 1, further comprising:
a sealing member configured to bond the cap with the substrate; and
a plurality of signal output portions, each including a through via that passes through the cap or the substrate, and connected to a section of the signal channel located on the opposite side to the input point with respect to the corresponding fixed contact, wherein
the space in the cap is sealed by the sealing member, and
the sealing member is arranged so as to surround the through vias of the signal input portion and the plurality of signal output portions.

6. The electrostatic micro relay according to claim 1, further comprising
an external electrode connected to the through via, wherein
the external electrode is arranged on the surface of the cap which is located on the opposite side to the opposed surface to the substrate when the through via is provided in the cap, and
the external electrode is arranged on the surface of the substrate which is located on the opposite side to the surface formed with the signal line when the through via is provided in the substrate.

7. The electrostatic micro relay according to claim 5, wherein
each of the plurality of signal output portions includes the through via formed in the cap.

8. The electrostatic micro relay according to claim 5, wherein
each of the plurality of signal output portions includes the through via formed in the substrate.

9. The electrostatic micro relay according to claim 1, wherein
the signal input portion includes the through via formed in the cap.

10. The electrostatic micro relay according to claim 1, wherein
the signal input portion includes the through via formed in the substrate.

11. The electrostatic micro relay according to claim 1, wherein
the cap and the substrate are formed of glass.

12. The electrostatic micro relay according to claim 1, wherein
at least one of the plurality of movable electrodes has a double-supported beam structure configured to support the movable contact.

13. The electrostatic micro relay according to claim 1, wherein
the plurality of signal channels are two signal channels arranged so as to form one straight line, and
the signal line has a pad connected to the signal input portion to define the input point.

14. A manufacturing method for an electrostatic micro relay, comprising the steps of:
forming a substrate; and
forming a signal line on the substrate, wherein
the signal line has an input point configured to receive a signal and a plurality of signal channels configured to distribute the signal, the plurality of signal channels being each formed with a fixed contact,
the manufacturing method further comprises the steps of:
forming a plurality of movable contacts, each provided with respect to each of the fixed contacts and arranged so as to be opposed to a corresponding fixed contact across a space, and a plurality of movable electrodes, each connected to each of the plurality of movable contacts;
forming a cap with a through via and a space configured to house the plurality of movable electrodes; and
bonding the cap with the substrate by a sealing material, and
the through via in the cap is connected to the input point of the signal line in the bonding step.

15. A manufacturing method for an electrostatic micro relay, comprising the steps of:
forming a substrate; and
forming on the substrate a signal line and a through via to be connected to the signal line, wherein
the signal line has an input point configured to receive a signal and a plurality of signal channels configured to distribute the signal,
the plurality of signal channels are each formed with a fixed contact,
the through via is connected to the input point of the signal line, and
the manufacturing method further comprises the steps of:
forming a plurality of movable contacts, each provided with respect to each of the fixed contacts and arranged so as to be opposed to a corresponding fixed contact across a space, and a plurality of movable electrodes, each connected to each of the plurality of movable contacts;
forming a cap with a through via and a space configured to house the plurality of movable electrodes; and
bonding the cap with the substrate by a sealing material.

* * * * *